United States Patent [19]

Gasner

[11] Patent Number: 4,599,789
[45] Date of Patent: Jul. 15, 1986

[54] PROCESS OF MAKING TWIN WELL VLSI CMOS

[75] Inventor: John T. Gasner, Melbourne, Fla.

[73] Assignee: Harris Corporation, Melbourne, Fla.

[21] Appl. No.: 620,835

[22] Filed: Jun. 15, 1984

[51] Int. Cl.$^4$ .................. H01L 21/265; B01J 17/00
[52] U.S. Cl. .................. 29/571; 29/576 B; 148/1.5; 148/187; 156/643; 357/42; 357/91
[58] Field of Search .................. 148/1.5, 187; 29/571, 29/576 B; 156/643; 357/91, 42

[56] References Cited

U.S. PATENT DOCUMENTS

| 3,759,763 | 9/1973 | Wang | 148/188 |
|---|---|---|---|
| 4,209,350 | 6/1980 | Ho et al. | 148/188 |
| 4,280,272 | 7/1981 | Egawa et al. | 29/571 |
| 4,319,395 | 3/1982 | Lund et al. | 29/571 |
| 4,333,099 | 6/1982 | Tanguay et al. | 357/67 |
| 4,343,082 | 8/1982 | Lepselter et al. | 29/576 B |
| 4,356,040 | 10/1982 | Fu et al. | 148/1.5 |
| 4,356,623 | 11/1982 | Hunter | 29/571 |
| 4,366,613 | 1/1983 | Ogura et al. | 29/571 |
| 4,385,947 | 5/1983 | Halfacre et al. | 148/187 |
| 4,411,058 | 10/1983 | Chen | 29/571 |
| 4,420,344 | 12/1983 | Davies | 148/1.5 |
| 4,434,543 | 3/1984 | Schwabe et al. | 29/576 B |
| 4,435,896 | 3/1984 | Parrillo et al. | 29/571 |
| 4,442,591 | 4/1984 | Haken | 29/571 |
| 4,444,605 | 4/1984 | Slawinski | 148/187 |
| 4,453,306 | 6/1984 | Lynch et al. | 29/571 |

OTHER PUBLICATIONS

"Fabrication of High-Performance LDDFET's with Oxide Sidewall-Spacer Technology"; Tsang et al.; IEEE; vol. ED-29, No. 4, Apr. 1982, pp. 590-596.
"An Optimally Designed Process for Submicrometer MOSFET's"; Shibata et al.; IEEE, vol. ED-29, No. 4, Apr. 1982, pp. 531-535.
"Twin-Tub CMOS—A Technology for VLSI Circuits"; Parrillo et al.; IEDM, 1980, pp. 752-755.
"Twin-Tub CMOS II—An Advanced VLSI Technology"; Parrillo et al.; IEDM 1982, pp. 706-709.
"Quadruple-Wall CMOS—A VLSI Technology"; Chen; IEDM 1982, pp. 791-792.

Primary Examiner—Upendra Roy
Attorney, Agent, or Firm—Barnes & Thornburg

[57] ABSTRACT

CMOS devices are formed in self-aligned wells in a substrate produced by a two mask, one photolithographic step process wherein the first mask is used as a template to form the second inverse mask of substantially equal thickness. The gates are used as alignment mask for shallow source and drain regions and subsequently formed lateral gate spacers are used as alignment mask for deep source and drain regions. Exposed source and drain regions and silicon gates have silicide formed thereon by a non-selective process.

14 Claims, 20 Drawing Figures

PROCESS OF MAKING TWIN WELL VLSI CMOS

BACKGROUND AND SUMMARY OF THE INVENTION

The present invention relates generally to integrated circuits and method of manufacturing and more specifically to a method of manufacturing self-aligned junction isolated complementary insulated gate field effect transistors.

The industry is constantly working toward increasing the device density on a wafer or chip. The number of devices that can be placed on a chip is limited by the size of the device and the electrical interaction. These place restraints on the spacing between devices. Further limitation are in the processing steps dealing with photolithography and the ability to form doped regions of the controllable size and impurity concentration. For junction isolated insulated gate field effect transistors, the design must minimize device latch-up resulting from parasitic bipolar devices. It is also desirable to reduce the capacitance of the device as well as the contact and interconnect system. Hot electron and the substrate current injection is another problem which must be faced for insulated gate field effect transistors as well as reducing the resistance of the contacts and junctions.

Although all of these problems have been addressed singly by the prior art, the industry is continuously searching for complete process flows which address as many of these problems as possible. Thus, it is an object of the present invention to address as many of the design restraints as possible while increasing the density of the devices on a chip.

Another object of the present invention is to provide a process flow with a minimum number of masking steps.

Still another object of the present invention is to provide a unique process for forming a reverse image mask.

Yet another object of the present invention is to minimize latch-up.

A further object of the present invention is to provide a process which allows tailoring of the threshold of the devices.

An even further object of the present invention is to inhibit hot electron and substrate current injection.

A still even further object of the present invention is to provide a reduced resistance of junction in contacts.

Another object of the present invention is to lower the overall capacitance of the integrated circuit.

These and other objects of the invention are attained by forming a first mask on a substrate of a first conductivity type and introduction of second conductivity type impurities to form a second conductivity type well. This is followed by a second mask which is the reversed image of the first mask and introduction of a first conductivity type impurities to form a first conductivity type well. The second mask may be formed by other processes. It is preferred that the second mask edges be self-aligned to the first mask. A gate insulative layer and gate materials are formed on the two well areas. This is followed by forming shallow source and drain regions using the gate as a mask in each of the wells. Next, insulative spacers are formed extending laterally from the first and second gates over the source and drain regions and impurities are introduced to form deeper source and drain regions using the gate and the spacers as a mask. This is followed by the forming of the contacts to the respective layers. The gate material is polycrystalline silicon and the impurity introduction steps are carried out by ion implantation. A metal silicide step is performed to reduce the contact resistance by forming metal silicide over the source and drain regions as well as the gate. Insulative inserts are formed between the device regions by etching and filling by deposition to form planar oxide inserts separating the device regions laterally.

A method of forming self-aligned well regions including the inverse image masking step includes forming the first mask followed by introducing impurities to form the first well region. The inverse mask is formed by applying a second mask layer overfilling the openings in the first mask and covering the first mask. The second mask layer is removed sufficiently to expose at least a portion of the first mask layer. The exposed first mask layer and any first mask layer superimposed thereon is selectively removed to iorm the second mask having the reversed image of the first mask. This is followed by introducing the impurities of the opposite conductivity type to form a second well.

Other objects, advantages and novel features of the present invention will become apparent from the following detailed description of the invention when considered in conjunction with the accompanying drawings.

DETAILED DESCRIPTION OF THE DRAWINGS

Figure 1:
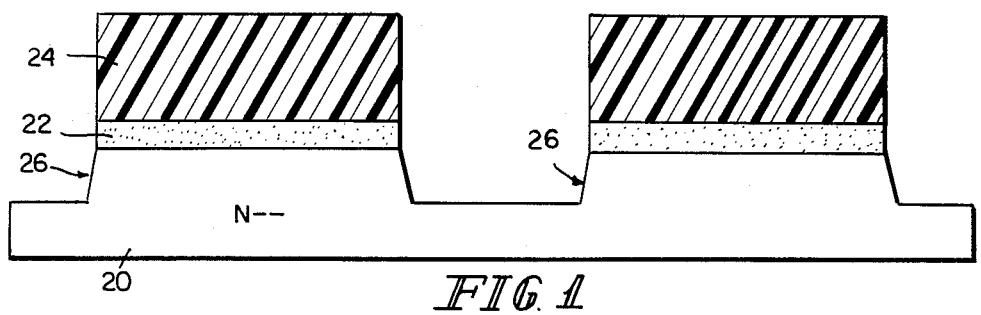
FIGS. 1–3 illustrate a portion of the process incorporating the principles of the present invention.

The process of fabrication begins as illustrated in FIG. 1 with a substrate 20 which for purposes of example will be an N-conductivity type silicon having an impurity concentration in the range of $10^{15}$ atoms per cubic centimeter. The substrate 20 may be an original substrate or may be an epitaxial layer formed on another substrate layer. The substrate is processed to form lateral dielectric isolation regions. This results in mesa areas in which the field effect transistors will be formed. An insulative layer, for example silicon dioxide 22, is formed on the silicon substrate 20 and a photoresist layer 24 is formed on the oxide layer 22. The photoresist layer is then patterned by the well-known technique to form openings and act as a mask. The photoresist layer 24, the oxide layer 22 and the substrate 20 are then etched to form trenches 26. The etchant may be a wet etch or a dry etch. When using the wet etch, the angle that the walls form with respect to the horizontal should be between 60° and 90°. The steeper walls are preferred since it creates devices with effectively wider channels.

Figure 2:
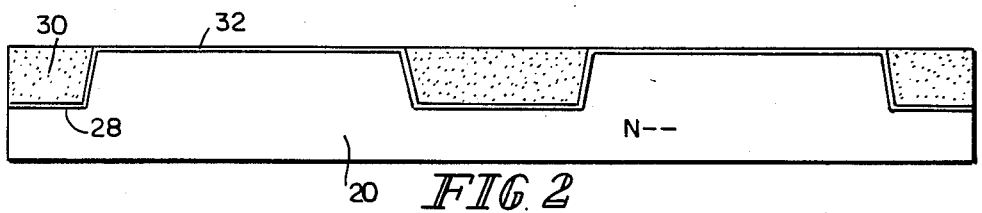

The photoresist layer 24 and oxide layer 22 are removed immediately after etching the trenches. Then the entire surface is thermally oxidized to form a thin oxide region 28. An insulative material, for example oxide, is then chemically vapor deposited to back fill the trenches 26. The excess chemical vapor deposited oxide are then removed in a planarization process to provide inserts 30 planar with the top of the substrate 20. The inserts 30 have, for example, a depth of 5000 Angstroms from the surface. The substrate 20 is then oxidized to provide a thin oxide coating 32. The resulting structure is illustrated in FIG. 2. The inserts 30 may be formed by other processes and it is preferred that an insulator insert be used to provide lateral dielectric isolation.

Figure 3:
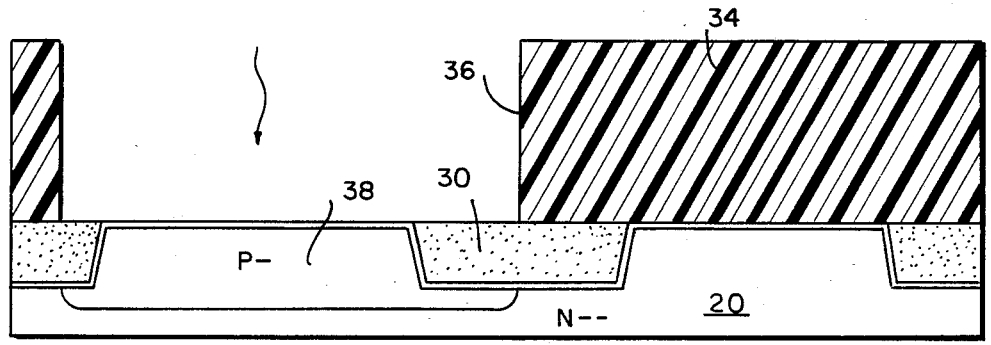

The next sequence of steps produce self-aligned twin wells in which the field effect transistor devices are to be formed. This process involves using a first mask and then forming a second mask which is the inverse image of a first mask. A first masking material 34, for example a photoresist or a polyimide, is formed on the surface of the substrate 20. An opening 36 is formed in the mask 34 to expose the areas in which the P-wells are to be formed. A P-type impurity, for example boron, is ion implanted at sufficient energy level and dose to form the P— well 38 illustrated in FIG. 3 having an impurity concentration greater or equal to $10^{16}$ atoms per cubic centimeter and a depth of, for example, 15,000 Angstroms in mesa areas and 5000 Angstroms in oxide filled areas. The photoresist layer 34 generally has a thickness in the range of 10,000 to 20,000 Angstroms. Additional boron implants can optionally be done at this time, using different doses and energies, to create a tailored impurity doping concentration for the P— for device requirements.

Figure 4:
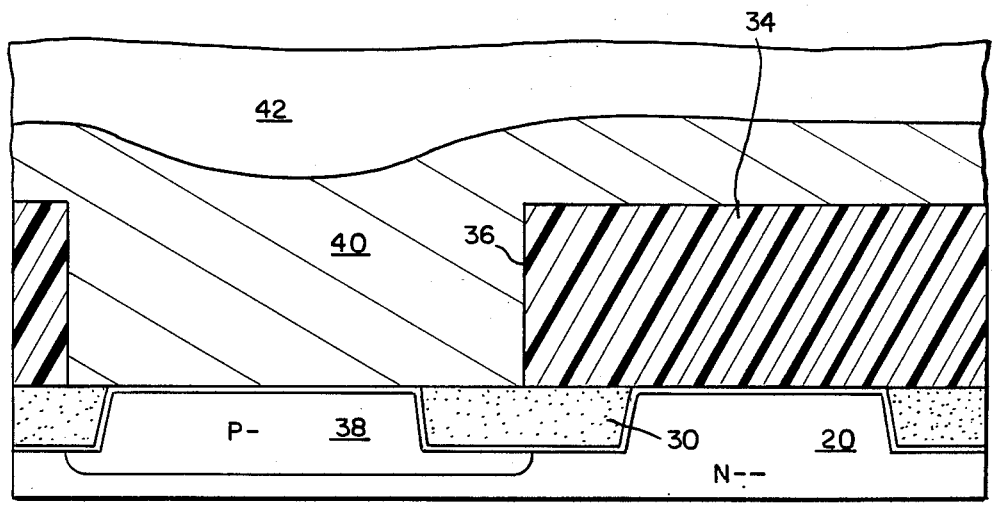
FIGS. 4–6 illustrate a first method of forming an inverse mask incorporating the principles of the present invention.
Figure 5:
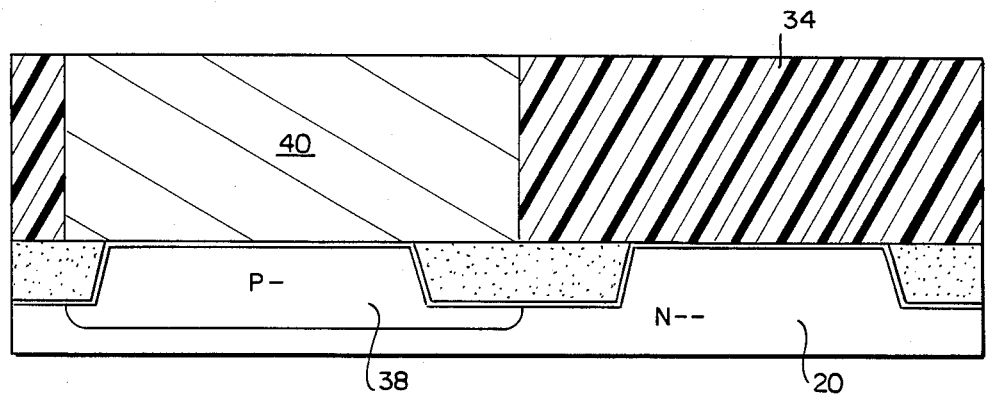
Figure 6:
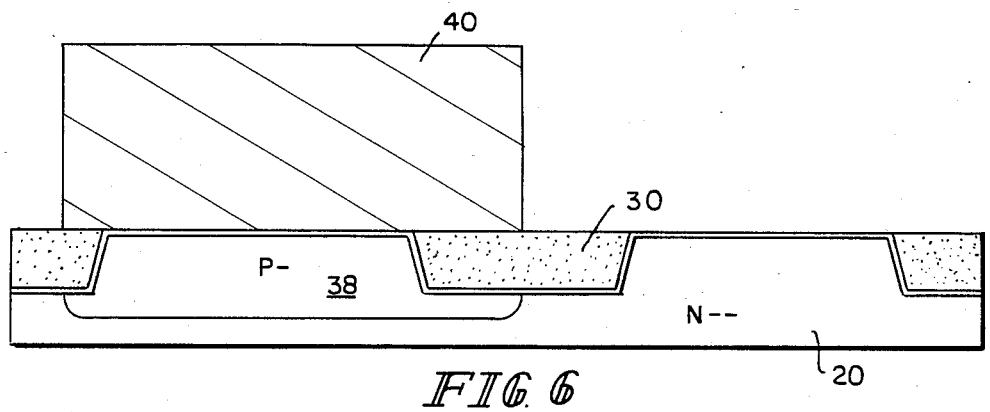

The formation of the second mask includes applying a metal layer 40 which fills the previous opening 36 in the first mask layer 34. The metal layer 40 is then planarized by applying a planarization layer 42 which may be, for example a photoresist or polyimide layer. By way of example, the metal layer 40 which may be aluminum, is formed to have a thickness of 10,000 to 20,000 Angstroms on the surface of the first masking layer 34 and the planarization layer 42 has a thickness above the planar part of the metal layer in the range of 10,000 to 20,000 Angstroms. The resulting structure is illustrated in FIG. 4. The planarization process includes etching the planarization layer 42 and the metal layer 40 at appropriate rates such that the resulting metal layer 40 is planar with the top of the first mask layer 34 as illustrated in FIG. 5. This may be accomplished by reactive ion etching using the appropriate gas and energy level to accomplish planarization. Planarization techniques are well known in the prior art and thus will not be described herein in detail. The first mask layer 34 is then selectively removed by an appropriate wet or dry etchant. This results in a mask layer 40 of metal which is the inverse image of the original mask layer 34 as illustrated in FIG. 6.

Figure 7:
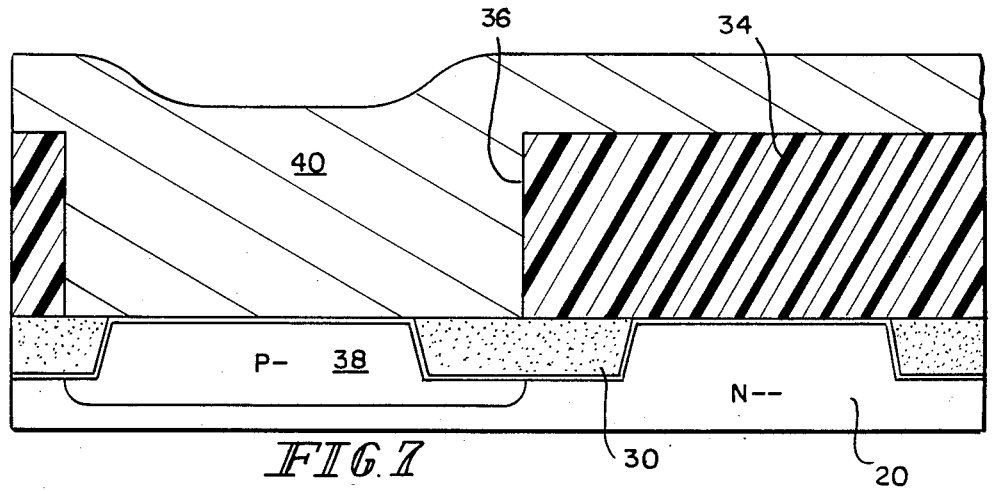
FIGS. 7 and 8 illustrate a second method of forming an inverse mask according to the principles of the present invention.
Figure 8:
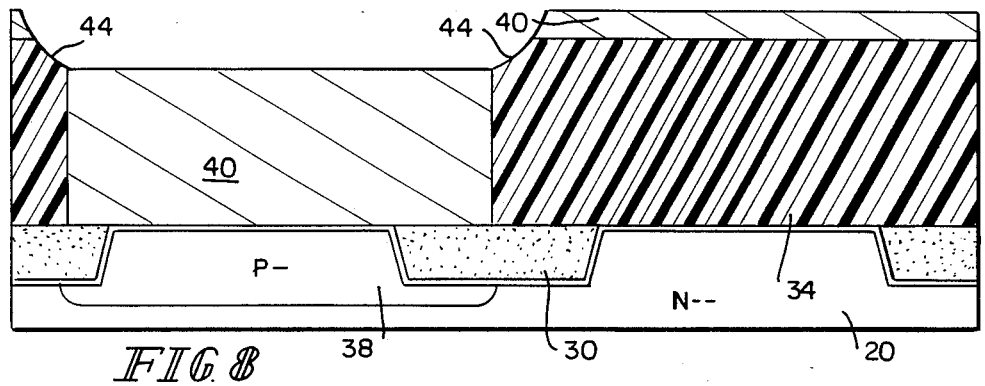

An alternative method of forming the second mask layer which is the inverse of the first mask layer includes forming the second mask layer or metal layer 40 to a sufficient depth to fill the opening 36 in the first mask layer 34 as illustrated in FIG. 7. For a first mask layer 34 having a thickness of 10,000 to 20,000 Angstroms, the second masking layer 40 would have a thickness on the first mask layer 34 of 10,000 to 20,000 Angstroms. The metal layer 40 is then etched using either wet or dry etch until a portion of the first mask layer 34 is exposed. Since only a single layer is being etched, the etch rate is uniform and the corners of the opening 36 will become exposed because of the topology of the metal layer 40. As illustrated in FIG. 8, edge 44 of mask layer 34 is exposed and partially etched. A first mask layer 34 is then selectively removed using a wet etchant which not only removes the first mask layer 34, but also removes the portions of the metal layer 40 which are superimposed thereon. This lift-off technique results in the same mask layer 40 of FIG. 6 having inverse image of the mask layer 34 of FIG. 3.

Since the alternative inverse mask forming process does not attempt to form a planar surface before etchings, the deposited second layer may be substantially thinner with a pronounced indenture. This reduces the time and cost of applying and etching the second mask layer.

Although two techniques are described for forming an inverse mask, other methods may be used to form the second mask. As will be described below, the edges of the mask openings should be aligned so as to form self-aligned wells with little if any overlap. Any dual photolithic techniques requires lateral spacing because of the tolerances of the lithographic processes to assure no overlap of the formed regions. Similarly, prior single lithographic techniques could not truly form inverse mask, and, thus, lateral spacing or guard rings were also required.

Figure 9:
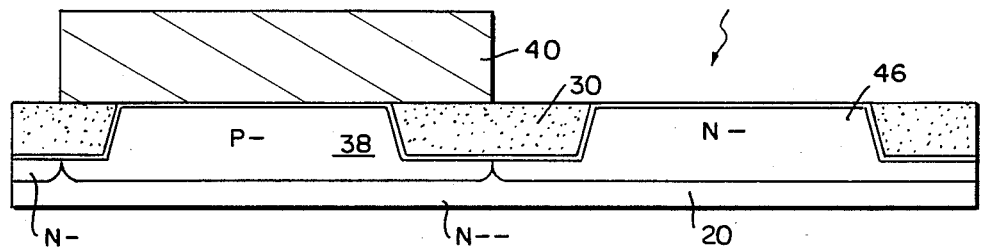
FIGS. 9–16 illustrate the remainder of the process incorporating the principles of the present invention.

N-type impurities, for example phosphorous, are then introduced for example, by ion implantation to form the N— well 46. The N— well which is aligned with the previously formed P-well 38 has an impurity concentration of equal to or greater than $10^{16}$ atoms per cubic centimeter and a depth of 15,000 Angstroms. The second mask layer 40 is removed and the substrate is annealed. The resulting structure is illustrated in FIG. 9. The self-aligned dual well 38 and 46 remove the need for separate guard rings. Thus, removing additional steps to form the guard rings. It should be noted that by using ion implantation to form the wells, very little side diffusion occurs and therefore the spacing between the devices may be reduced. Similarly, very high peak doping results which reduces the latch-up problem by forming high threshold parasitic field effect transistors. The resulting well's surface doping also results in relatively low junction capacitance.

Figure 10:
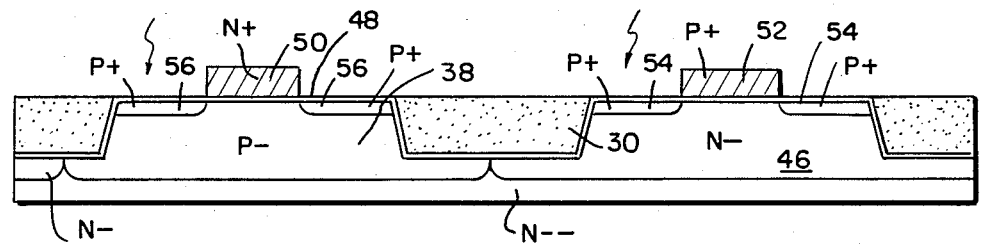

Complementary insulated gate field effect transistors are formed by forming a gate oxide layer 48 on the surface of the substrate by, for example, exposing the substrate to an oxidizing atmosphere followed by the application of a gate material and delineation to form gate regions 50 and 52. In the preferred embodiment, the gates 50 and 52 are made from polycrystalline silicon. A first type P impurity, for example boron, is ion implanted non-selectively using the gates 50 and 52 and the oxide inserts 30 as a mask to produce shallow regions 56 in well 38 and shallow regions 54 in well 46 as illustrated in FIG. 10.

Figure 11:
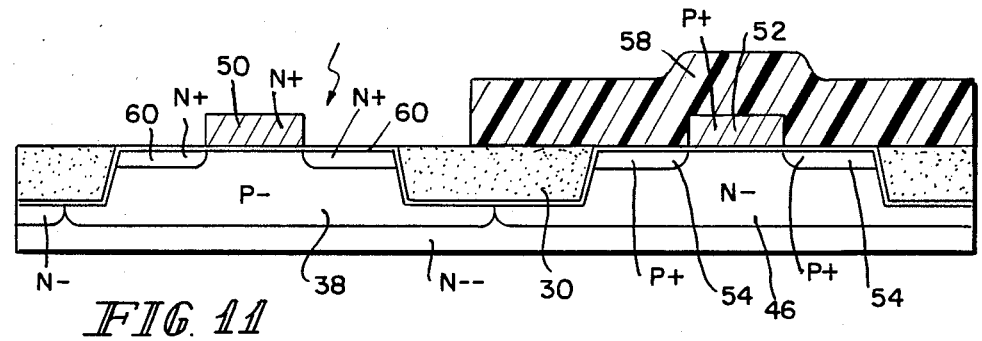

A mask is formed by applying photoresist layer 58 and delineating to mask the N— well region 46 and expose the P— well region 38. N-type impurities, for example arsenic, are implanted using the mask 58 and the gate 50 in combination with oxide inserts 30 to form shallow N+ source and drain regions 60. The ion implantation is carried out at a sufficient level to overcome the original P+ regions 56 in well 38. The initial introduction of P+ impurities into the P— well 38 allows for greater range for the formation of the N+ source and drain regions 60. The resulting structure is illustrated in FIG. 11. The mask layer 58 is removed. The structure at this point has shallow source and drain regions formed in each of the complementary field effect transistor wells having a depth in the range of 1000 to 2000 Angstroms and an impurity concentration in the range of $10^{18}$ to $10^{19}$ atoms per cubic centimeter.

The next sequence of operation form the deep source and drain region portions. This process begins with the formation of spacers extending laterally from the gate regions 50 and 52. These spacers are formed by depositing an insulative layer, for example chemical vapor deposition of silicon dioxide over the surface of the substrate. The oxide layer is then reactive ion etched to form the spacer regions 62 extending from gate 50 and spacers 64 extending from gate 52. These spacers result from the uneven topology of the deposited silicon oxide layer. This process is well known in the prior art and, thus, is not described in detail.

Figure 12:
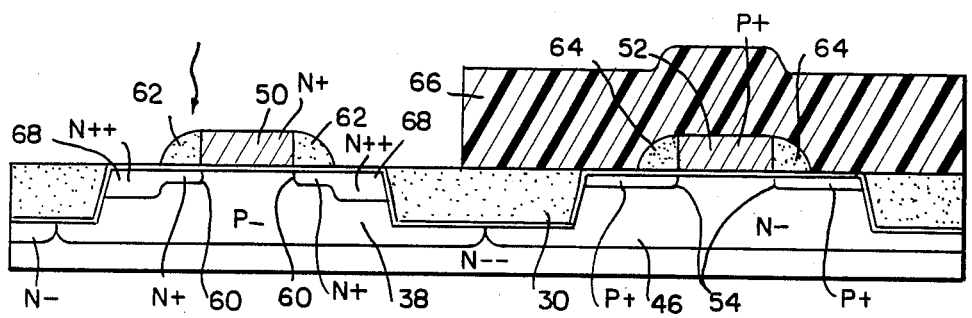
Figure 13:
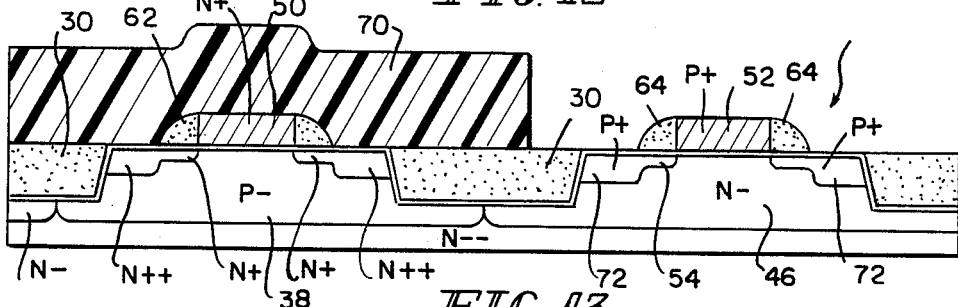

After formation of the spacers, a masking layer 66 is applied over the substrate and delineated to mask N— well region 46 and exposed P— well region 38. N+ impurities, for example phosphorous, are ion implanted using the mask layers 66, the gate 50 and the spacers 62 as well as inserts 30 as a mask. This results in deep N+ source and drain regions 68 extending laterally from the shallow N+ source and drain regions 60 as illustrated in FIG. 12. The masking layer 66 is removed and a new masking layer 70 is applied and delineated to expose well 46 and mask well 38. P-type impurities, for example boron, are ion implanted using the mask layer 70, the gate 52, spacers 64 and the oxide inserts 30 as alignment mask. This results in the deep P+ source and drain regions 72 extending laterally from the shallow source and drain regions 54 as illustrated in FIG. 13 having a depth in the range of 3000 to 4000 Angstroms and an impurity concentration in the range of $10^{18}$ to $10^{20}$ atoms per cubic centimeter. The photoresist layer 70 is removed. This completes the device formation steps.

It is evident from FIG. 13 that the polycrystalline gates 50 and 52 are of a lower resistance and are doped as N+ and P+ respectively having an impurity concentration in the range of $10^{18}$ to $10^{20}$ atoms per cubic centimeter.

Figure 14:
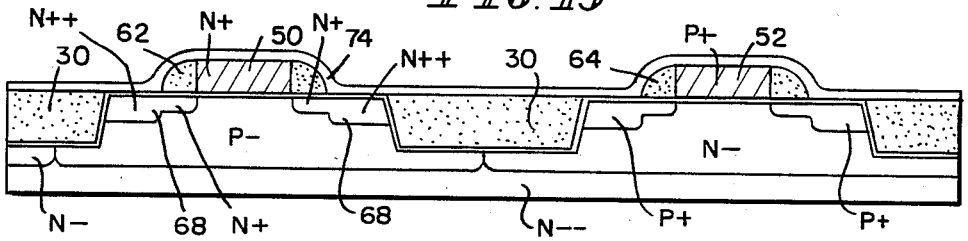
Figure 15:
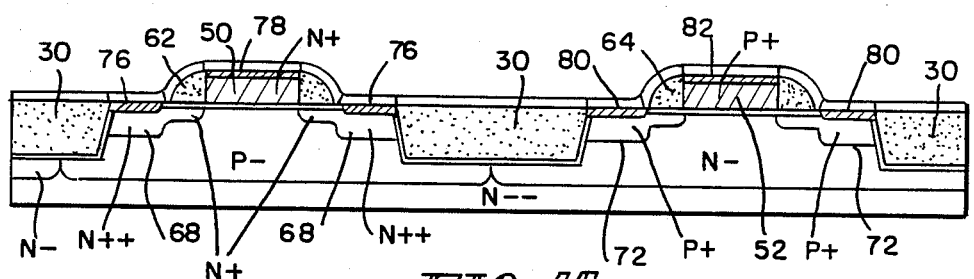

The formation of the field oxide and the contacts is the final processing sequence. In order to reduce the junction resistance and provide barrier metal for shallow junctions, a silicide forming metal layer 74 is applied to the substrate as illustrated in FIG. 14. This layer may be, for example platinum. The wafer is then heated to cause platinum silicide to form in those regions where the platinum contacts the polycrystalline silicon gate or the silicon substrate. As illustrated in FIG. 15, this includes the platinum silicide regions 76 on deep source and drain regions 68, region 78 on gate 50, regions 80 on deep source and drain regions 72 and region 82 on gate 52. No platinum silicide is formed over the oxide inserts 30 or the spacers 62 and 64. The portions of the platinum which should not form platinum silicide is easily selectively removed using, for example, hot concentrated Aqua Regia.

The use of the oxide spacers inhibit hot electron and substrate current injection as well as providing better gate oxide reliability. Used in combination with the metal forming silicides, a self-alignment technique for the silicide formation without a mask results. The spacers also smooth out the sharp edges of the gate material for better contact metal coverage.

Figure 16:
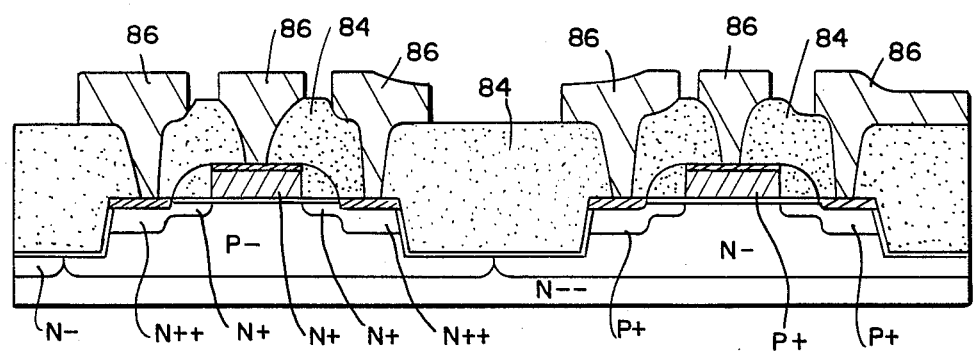

A field oxide layer 84 is then formed over the wafer by chemical vapor deposition for example and vias are etched to provide contacts to the platinum silicide portion of the source and drain regions and the gate regions. A layer of contact metal is then applied and delineated to form contacts 86. The resulting structure is illustrated in FIG. 16. An insulative layer may be provided over the first metal layer 86 and a second layer of metal provided.

Figure 17:
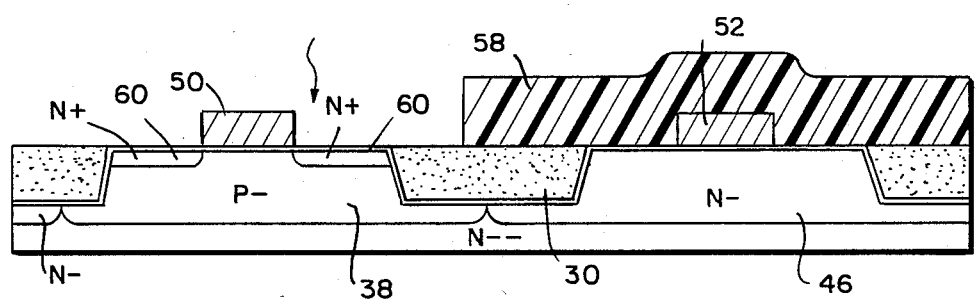
FIGS. 17–20 illustrate of a modification of the process of FIGS. 10–13.
Figure 18:
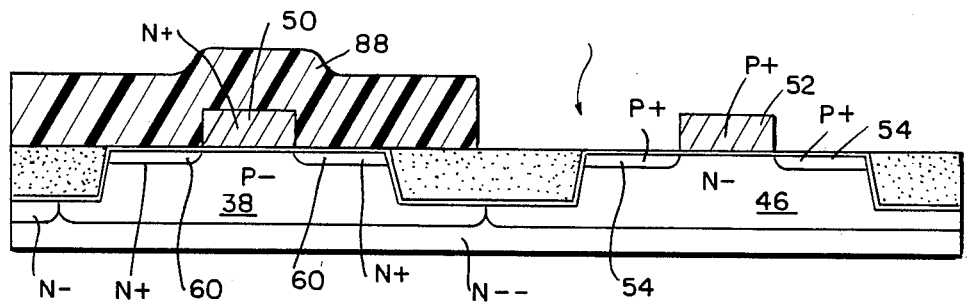
Figure 19:
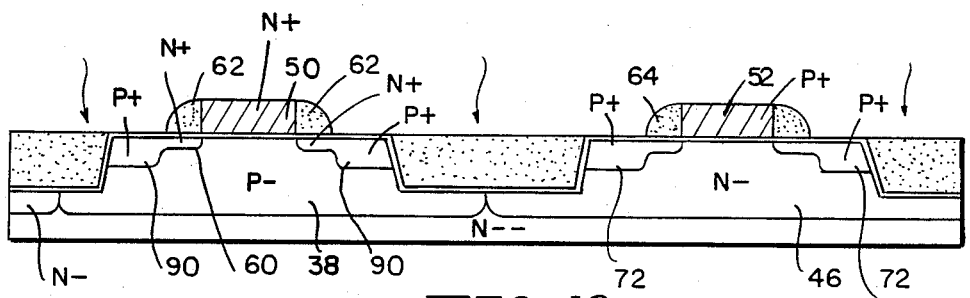
Figure 20:
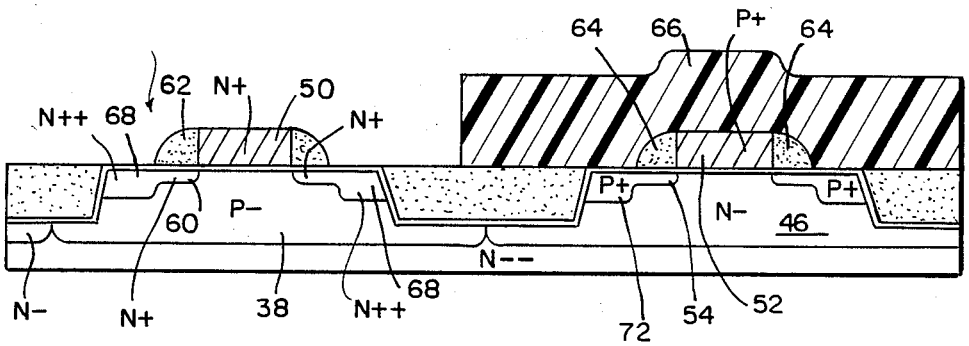

An alternative method for forming the shallow and deep source and drain regions includes, as illustrated in FIG. 17, forming the masking layer 58 blocking the N— well region 46 and exposing the P— well region 38. The N+ arsenic implant is performed to form shallow source and drain regions 60. The photoresist layer 58 is removed and a photoresist layer 88 is applied and delineated to form a mask layer blocking the P— well region 38 and exposing the N— well region 46. P+ type impurities are implanted to form the P+ source and drain regions 54. The masking layer 88 is removed and a non-selective P-type boron implant is performed forming deep P+ source and drain regions 72 and P+ source and drain regions 90 in wells 46 and 38 respectively. A masking layer 66 is applied and delineated to expose the P— well region 38 and block the N— well region 46. N-type impurities, for example phosphorous, are implanted to form the deep N+ source and drain regions 68. This implantation must be carried out at sufficient power levels to overcome the P+ regions 90 originally formed in the prior step. The resulting structure is illustrated in FIG. 20. The mask layer 66 is removed and the process is continued as previously described for FIGS. 14–16.

The process of FIGS. 17–20 are substantially similar to the process steps of FIGS. 10–13 in that three masking steps are used for four implantations to form the two part source and drain regions for complementary insulated gate field effect transistors. This results since one of the implantation or doping step is performed non-selectively. The difference is, in FIGS. 10–13, the non-selective implantation is at the beginning of the process, whereas in the process of FIGS. 17–20, the non-selective implantation is in the middle of the process. As can be noted, the implantation of the P and N source and drain regions have been reversed in the two process flows. Since all the impurity introduction is by low temperature ion implantation, it is not critical that the N implantation precede the P implantation. The importance of the sequence of steps is that the shallow source and drain regions are formed using the gate as the alignment mask and that the deeper regions are formed using the spacer as the alignment mask.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method for forming complementary insulated gate field effect transistors comprising:
    forming at least one insulative insert in a substrate of a first conductivity type to form at least a first and second mesas in said surface separated laterally by said insert;
    forming a first mask layer having a first opening on said substrate;

introducing second conductivity type impurities opposite said first conductivity type into said substrate through said first opening to form simultaneously a second conductivity type well in said second mesa having a higher impurity concentration at the bottom of said well and guard ring under a portion of said insert;

forming a second mask on said surface, the reverse image of said first mask using said first mask as a template;

introducing first conductivity type impurities into said substrate through an opening in said second mask to form simultaneously a first conductivity type well in said first mesa having a high impurity concentration at the bottom of said well and a guard ring under a portion of said insert;

forming a gate insulative layer on said substrate;

forming first and second gates on said gate insulative layer over said first and second wells, respectively;

introducing second conductivity type impurities into said first well using said first gate as a mask to form shallow source and drain regions;

introducing first conductivity type impurities into said second well using said second gate on a mask to form shallow source and drain regions;

forming insulative spacers extending lateral from said first and second gates over said source and drain regions;

introducing sell using said second gate and spacers as a mask to form deep source and drain regions having a greater depth than said shallow source and drain regions.

2. A method according to claim 1 wherein said first and second gates and said substrate are formed of silicon; and further including forming oxide regions between said wells before forming said source and drain regions, non-selectively forming a silicide forming material over said substrate after forming said deep source and drain regions, heating to form a metal silicide on said gate and source and drain regions, and removing said silicide forming material from said spacers and oxide regions.

3. A method according to claim 1 wherein:

introducing impurities to form said shallow source and drain regions in said first well is performed using said gates only as a mask;

introducing impurities to form said shallow source and drain regions in said second well includes forming a mask covering said first well;

introducing impurities to form said deep source and drain regions in said second well includes forming a mask covering said first well; and introducing impurities to form said deep source and drain regions in said first well includes forming a mask covering said second well.

4. A method according to claim 1 wherein:

introducing impurities to form said shallow source and drain regions in said first well includes forming a mask covering said second well;

introducing impurities to form said shallow source and drain regions in said second well includes forming a mask covering said first well;

introducing impurities to form said deep source and drain regions in said first well is performed using said gate only as a mask; and introducing impurities to form said deep source and drain regions in said second well includes forming a mask covering said first well.

5. A method according to claim 1 wherein all said impurity introduction steps include ion implantation.

6. A method according to claim 1 including forming oxide inserts in said substrate before forming said first mask; and wherein said impurities are introduced to form said first and second wells which extend below said oxide inserts.

7. A method according to claim 1 wherein forming said second mask includes:

applying a second mask layer to at least fill any opening in said first mask;

removing said second mask layer until a portion of said first mask is exposed; and selectively removing said first mask with any superimposed second mask layer.

8. A method according to claim 6 wherein forming said oxide inserts includes etching said substrate to form insert trenches and depositing oxide filling said trenches.

9. A method according to claim 8 wherein said oxide is deposited overfilling said trenches and including applying a planarization layer on said oxide and etching said planarization layer and oxide layer to form oxide inserts substantially planar with said substrate.

10. A method for forming complementary insulated gate field effect transistors comprising:

a forming at least one insulative insert in a substrate of a first conductivity type to form at least a first and second mesas in said surface separated laterally by said insert;

forming a first mask layer having an opening over said second mesa and a portion of said insulative insert;

introducing second conductive type impurities opposite said first conductivity type into said substrate through said opening to form a second conductivity well in said second mesa and under a portion of said insert and having a higher impurity concentration at the bottom of said well;

forming a second mask on said surface, the inverse image of said first mask using sid first mask as a template;

introducing first conductivity type impurities into said substrate through an opening in said second mask to form a first conductivity type well in said first mesa and under the remainder of said insert and having a higher impurity concentration at the bottom of said well;

removing said second mask;

forming a gate insulative layer on said mesas;

forming a first and second gate on said insulative layer on said first and second mesas respectively;

introducing first conductivity type impurities into said second mesa to form source and drain regions; and introducing second conductivity type impurities into said first mesa to form source and drain regions.

11. A method according to claim 10, wherein said wells are formed by ion implantation.

12. A method according to claim 10, wherein forming said inserts include etching said substrate to form insert trenches and depositing oxide filling said trenches.

13. A method according to claim 11, wherein said source and drain regions are formed by ion implantation.

14. A method according to claim 12, wherein said oxide is deposited overfilling said trenches and including applying a planarization layer on said oxide and etching said planarization layer and oxide layer to form oxide inserts substantially planar with said substrate.

* * * * *